（12） United States Patent
Yuan et al.

(10) Patent No.: US 9,848,518 B2
(45) Date of Patent: Dec. 19, 2017

(54) INTEGRATED POWER MODULE PACKAGING STRUCTURE

(71) Applicant: DELTA ELECTRONICS, INC., Taoyuan Hsien (TW)

(72) Inventors: Te-Wei Yuan, Taoyuan Hsien (TW); Hsueh-Kuo Liao, Taoyuan Hsien (TW); Yi-Kai Chou, Taoyuan Hsien (TW); Ming-Yuan Tsai, Taoyuan Hsien (TW); Wei-Hao Chi, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 429 days.

(21) Appl. No.: 13/854,356

(22) Filed: Apr. 1, 2013

(65) Prior Publication Data

US 2014/0198454 A1   Jul. 17, 2014

(30) Foreign Application Priority Data

Jan. 17, 2013   (TW) .............................. 102101729 A

(51) Int. Cl.

| | |
|---|---|
| *H05K 7/00* | (2006.01) |
| *H05K 7/20* | (2006.01) |
| *H01L 25/16* | (2006.01) |
| *H01L 23/049* | (2006.01) |
| *H05K 1/14* | (2006.01) |

(52) U.S. Cl.
CPC ............ *H05K 7/209* (2013.01); *H01L 23/049* (2013.01); *H01L 25/162* (2013.01); *H01L 25/165* (2013.01); *H01L 2924/0002* (2013.01); *H01L 2924/19107* (2013.01); *H05K 1/145* (2013.01)

(58) Field of Classification Search
USPC ......................................... 361/760, 761, 748
See application file for complete search history.

(56) References Cited

U.S. PATENT DOCUMENTS 5,519,252 A  *  5/1996  Soyano ................... H01L 21/56
                                                        257/177
6,521,830 B1 *  2/2003  Platz ....................... B29C 70/72
                                                        174/50

(Continued)

FOREIGN PATENT DOCUMENTS

TW         200503209        1/2005
TW         200532865        10/2005

*Primary Examiner* — Andargie M Aychillhum
(74) *Attorney, Agent, or Firm* — Hauptman Ham, LLP

(57) ABSTRACT

An integrated power module packaging structure includes a plastic housing having a cavity; a plurality of step-shaped pins embedded in the plastic housing, a first printed circuit board disposed in the cavity, and a second printed circuit board disposed above the first printed circuit board in the cavity. Each of the step-shaped pins includes a first L-shaped bending portion and a second L-shaped bending portion connected to each other. The first printed circuit board is disposed with at least a power device and is electrically connected to at least a part of the first L-shaped bending portions. Two opposite surfaces of the second printed circuit board are respectively disposed with at least an electronic device, and the second printed circuit board is electrically connected to at least a part of the second L-shaped bending portions.

11 Claims, 5 Drawing Sheets

(56) References Cited

U.S. PATENT DOCUMENTS

| | | |
|---|---|---|
| 6,914,321 B2 * | 7/2005 | Shinohara ............ H01L 23/4334 |
| | | 257/502 |
| 6,989,590 B2 | 1/2006 | Hanada et al. |
| 7,800,222 B2 | 9/2010 | Schulz et al. |
| 2002/0044215 A1 | 4/2002 | Takagi et al. |
| 2005/0127494 A1 | 6/2005 | Liu |
| 2005/0205970 A1 | 9/2005 | Chen et al. |
| 2011/0149537 A1 * | 6/2011 | Kurosawa ............ H01L 23/3675 |
| | | 361/760 |
| 2013/0329374 A1 * | 12/2013 | Lin ........................ H01L 23/10 |
| | | 361/728 |

* cited by examiner

INTEGRATED POWER MODULE PACKAGING STRUCTURE

RELATED APPLICATIONS

This application claims priority to Taiwan Application Serial Number 102101729, filed Jan. 17, 2013, which is herein incorporated by reference.

BACKGROUND

Field of Invention

The present invention relates to a packaging structure. More particularly, the present invention relates to an integrated power module packaging structure.

Description of Related Art

With rapid development of global automation and power saving, speed governors are widely used in various fields. Inverters and motors are utilized for providing different speed. A conventional inverter may include a power module, a driving device, thermal dissipating fins, and other peripheral components, and the size and the weight of the inverter is difficult to be reduced. However, the trend of the related product is minimizing, high power, and high density.

SUMMARY

The present invention provides an integrated power module packaging structure, in which a driving device and a power device are integrated in a packaging structure to form a three-dimensional stacking structure for saving space.

An aspect of the invention provides an integrated power module packaging structure, which includes a plastic housing having a cavity; a plurality of step-shaped pins embedded in the plastic housing, a first printed circuit board disposed in the cavity, and a second printed circuit board disposed above the first printed circuit board in the cavity. Each of the step-shaped pins includes a first L-shaped bending portion and a second L-shaped bending portion connected to each other. The first printed circuit board is disposed with at least a power device and is electrically connected to at least a part of the first L-shaped bending portions. Two opposite surfaces of the second printed circuit board are respectively disposed with at least an electronic device, and the second printed circuit board is electrically connected to at least a part of the second L-shaped bending portions.

In one or more embodiments, a part of the step-shaped pins are connected to both the first printed circuit board and the second printed circuit board.

In one or more embodiments, each of the first L-shaped bending portions comprises a first contact area exposed of the plastic housing, each of the second L-shaped bending portions comprises a second contact area exposed of the plastic housing, and the first and second contact areas are respectively connected to the first and second printed circuit boards.

In one or more embodiments, the integrated power module packaging structure further includes a plurality of bonding wires for connecting the first printed circuit board to at least a part of the first contact areas and connecting the second printed circuit board to at least a part of the second contact areas.

In one or more embodiments, the first printed circuit board has a plurality of pads, at least a part of the step-shaped comprises a plurality of extending portions connected to the first L-shaped bending portions, and the extending portions are physically connected to the pads.

In one or more embodiments, the second printed circuit board includes a multi-layer printed circuit board and a conductive layer disposed at an edge of the multi-layer printed circuit board, and the conductive layer is physically connected to at least a part of the second contact areas.

In one or more embodiments, a height of a part of the step-shaped pins vertical to the second printed circuit board is greater than a height of another part of the step-shaped pins vertical to the second printed circuit board.

In one or more embodiments, the plastic housing includes a flange, and the second printed circuit board is fastened on the flange.

In one or more embodiments, the plastic housing includes a groove, and the first printed circuit board is disposed in the groove.

In one or more embodiments, the integrated power module packaging structure further includes a heat dissipation component physically connected to the first printed circuit board.

In one or more embodiments, the heat dissipation component includes a heat dissipation substrate, the plastic housing includes a groove, and the heat dissipation substrate is disposed in the groove.

In one or more embodiments, the heat dissipation component further includes a plurality of fins disposed at a surface of the heat dissipation substrate opposite to the first printed circuit board.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
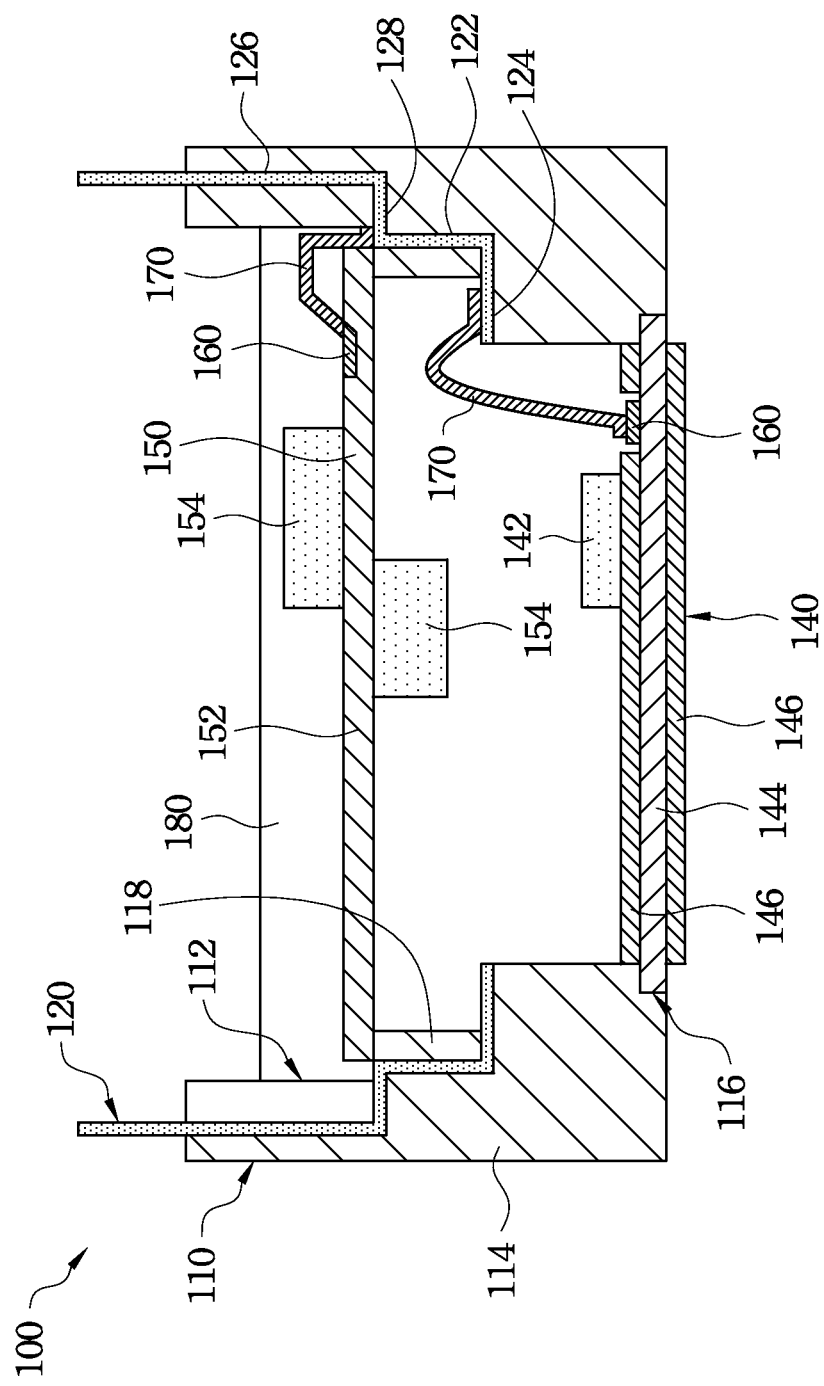
FIG. 1 is a cross-sectional view of a first embodiment of an integrated power module packaging structure of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a first embodiment of an integrated power module packaging structure of the invention. The integrated power module packaging structure 100 includes a plastic housing 110, a plurality of step-shaped pins 120, a first printed circuit board 140, and a second printed circuit board 150. The step-shaped pins 120 are embedded in the plastic housing. The plastic housing 110 includes a cavity 112. The first printed circuit board 140 and the second printed circuit board 150 are disposed in the cavity 112. The second printed circuit board 150 is disposed above the first printed circuit board 150.

The plastic housing 110 can be formed by an injection molding process, and the step-formed pins 120 can be embedded in the plastic housing by the same injection molding process. The cavity 112 is formed by designing a mold utilized in the injection molding process. The plastic housing 110 includes a sidewall 114 surrounding the cavity 112. The sectional profile of the sidewall 114 is a step-shaped block having a wider basement. The step-shaped pins 120 are embedded in the sidewall 114 of the plastic housing 110.

Each of the step-shaped pins 120 includes a first L-shaped bending portion 122 and a second L-shaped bending portion 126 connected to each other. The first L-shaped portion 122 has a vertical part and a horizontal part. The second L-shaped bending portion 126 has a vertical part and a horizontal part. The horizontal part of the first L-shaped bending portion is connected to the vertical part of the second L-shaped bending portion 126. The vertical part and the horizontal part are used for representing the relative position but not to limit the angle therebetween in 90 degree.

The plastic housing 110 includes a groove 116. The groove 116 is disposed at the basement of the sidewall 114. The first printed circuit board 140 is disposed in the groove 116. The first printed circuit board 140 can be fastened on the plastic housing with and adhesive.

There is a power device 142 disposed on the first printed circuit board 140. The power device 142 can be an IGBT, a MOSFET, a diode, etc. The power device 142 generates lots of heat while operating. Therefore, the first printed circuit board 140 can be a substrate with good thermal dissipation ability. For example, the first printed circuit board 140 can include a ceramic substrate 144 and a copper layer 146 coated on the ceramic substrate 144. The copper is a material with good thermal dissipation ability, so that the heat generated by the power device 142 can be dissipated rapidly. The power device 142 is disposed at an upper surface of the ceramic substrate 144 facing the cavity 112. The pattern of the copper layer 146 includes some spaces for locating the pins of the power device 144. Such that the situation of shortcuts between the pins of the power device 142 due to contacting the copper layer 146 can be prevented.

The first printed circuit board 140 includes a plurality of pads 160. The pads 160 are connected to the power device 142 by the wires formed on the ceramic substrate 144. Similarly, the layout of the copper layer 146 includes spaces for locating the wires and the pads 160 to prevent the situation of shortcuts between the pads 160 or the wires due to contacting the copper layer 146.

In each of the step-shaped pins 120, the first L-shaped bending portion 122 has a first contact area 124 exposed of the plastic housing 110. The integrated power module packaging structure 100 further includes a bonding wire 170 for connecting the pads 160 of the first printed circuit board 140 to the first contact area 124 of the first L-shaped bending portion 122. Namely, a wire bonding process is utilized in the integrated power module packaging structure 100 to connect the first printed circuit board 140 to the step-shaped pins 120.

The plastic housing 110 includes a flange 118. The flange 118 is arranged above the first printed circuit board 140. The second printed circuit board 150 can be fastened on the flange 118 by an adhesive. The second L-shaped bending portion 126 embedded in the plastic housing 110 also includes a second contact area 128 exposed of the plastic housing 110.

The second printed circuit board 150 may include a multi-layer printed circuit board 152 and plural electronic components 154 respectively disposed on opposite sides of the multi-layer printed circuit board 152. The integrated power module packaging structure 100 can be utilized in a inverter. The second printed circuit board 150 can be utilized as a control board or a driving board. The electronic component 154 disposed at the bottom surface of the multi-layer printed circuit board 152 (e.g. facing the first printed circuit board 140) can be electrically connected to the electronic is component 154 disposed at the top surface of the multi-layer printed circuit board 152 (e.g. facing away from the first printed circuit board 140) by the metal interconnection of the multi-layer printed circuit board 152. The second printed circuit board 150 further includes the pads 160. The pads 160 can be electrically connected to the electronic components 154 by metal interconnection. The second printed circuit board 150 and the step-shaped pins 120 can be connected to each other by a wire bonding process. The bonding wire 170 connect the pads 160 of the second printed circuit board 150 to the second contact areas 128 exposed of the plastic housing 110.

The integrated power module packaging structure 100 further includes a sealant 180. The sealant 180 is filled into the cavity 112 of the plastic housing 110 for fastening and protecting the components in the plastic housing 110.

According to different design requirements, a part of the step-shaped pins 120 are only electrically connected to the first printed circuit board 140, a part of the step-shaped pins 120 are only electrically connected to the second printed circuit board 150, and a part of the step-shaped pins 120 are electrically connected to both of the first printed circuit board 140 and the second printed circuit board 150. According to different connecting objects, a part of the step-shaped pins 120 are utilized for interconnecting the first printed circuit board 140 and the second printed circuit board 150, and another part of the step-shaped pins 120 are utilized for connecting the first printed circuit board 140 and/or the second printed circuit board 150 to an external component. Additional details of the step-shaped pins 120 are provided below with reference to the drawing.

Figure 2:
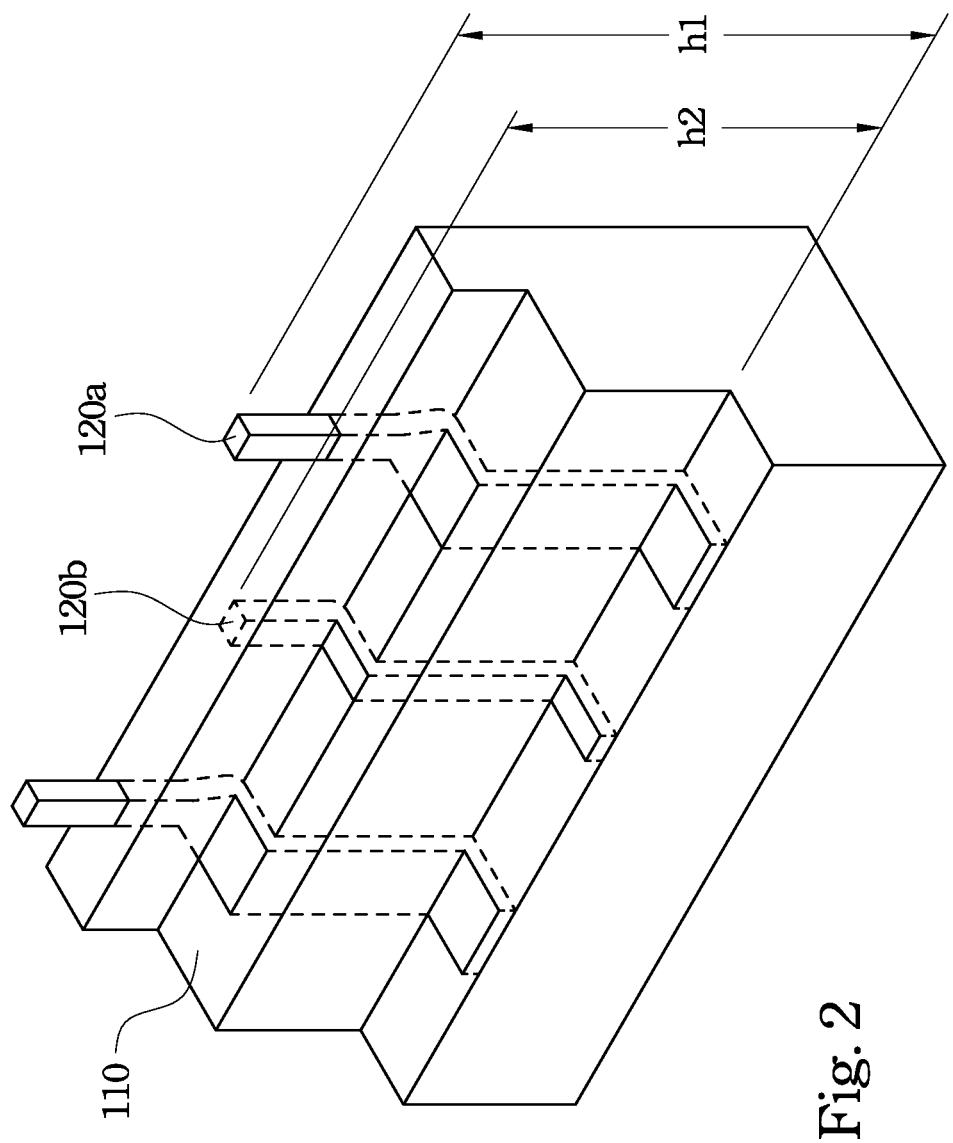
FIG. 2 is a partially oblique view of the integrated power module packaging structure of FIG. 1.

FIG. 2 is a partially oblique view of the integrated power module packaging structure 100 of FIG. 1. In this figure, only the plastic housing 110 and the step-shaped pins 120 are illustrated, the first printed circuit board and the second printed circuit board are hidden. The step-shaped pins 120 include the step-shaped pins 120a for external connecting and the step-shaped pins 120b for interconnecting. A height h1 vertical to the second printed circuit board 150 (as shown in FIG. 1) of the step-shaped pins 120a for external connecting is greater than a height h2 vertical to the second printed circuit board 150 (as shown in FIG. 1) of the step-shaped pins 120b for interconnecting.

Namely, the step-shaped pins 120a having a greater height are protruded from the plastic housing 110 for being utilized in external connecting, and the step-shaped pins 120b having a lower height are not protruded from the plastic housing 110 for being utilized in interconnecting.

Details of the plastic housing 110, the step-shaped pins 120, the first printed circuit board 140, and the second printed circuit board 150 are provided above with reference to FIG. 1 and FIG. 2. In the following embodiments, only the differences would be discussed, the part same as the first embodiment would not be discussed.

Figure 3:
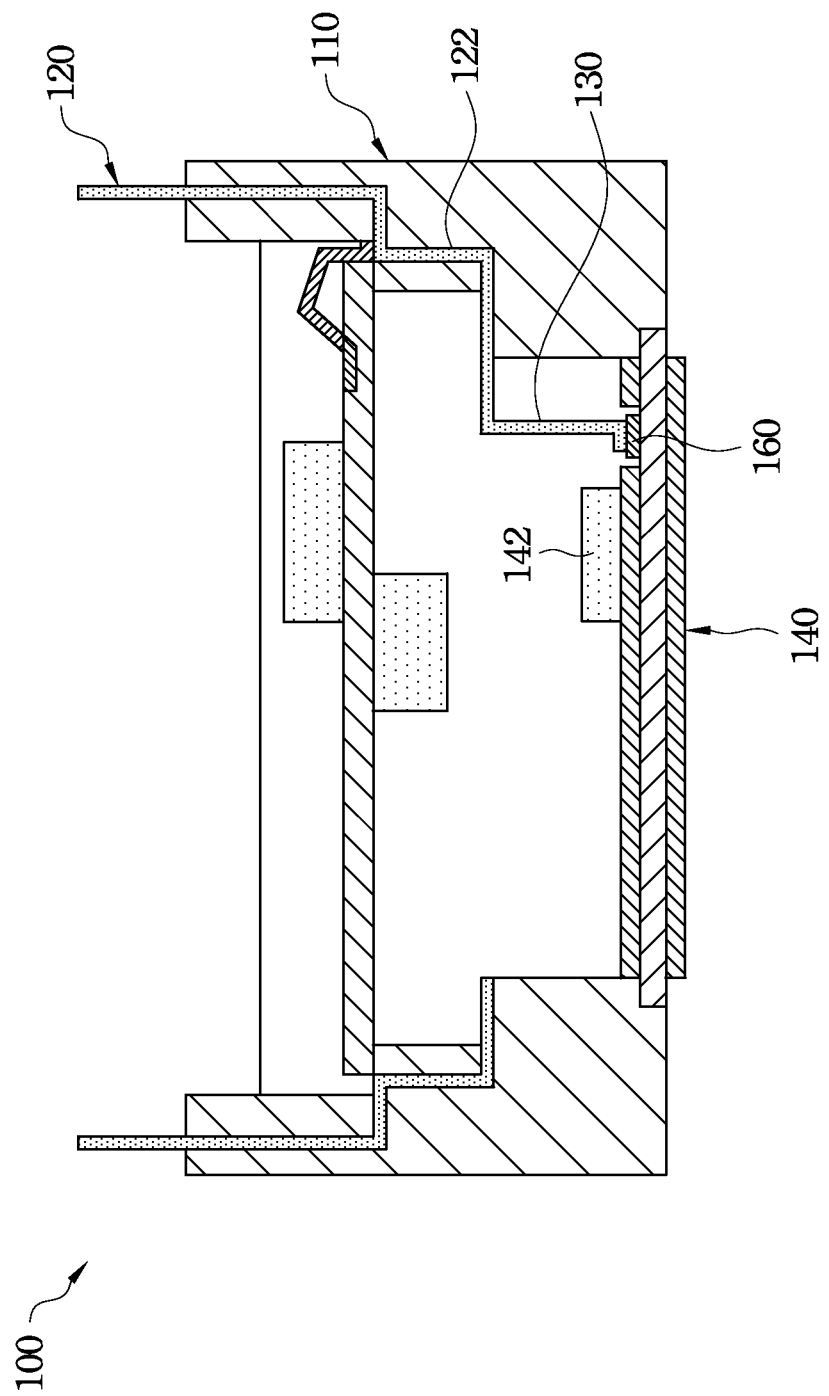
FIG. 3 is a cross-sectional view of a second embodiment of the integrated power module packaging structure of the invention.

FIG. 3 is a cross-sectional view of a second embodiment of the integrated power module packaging structure 100 of the invention. The difference between the first and second embodiment is that integrated power module packaging structure 100 of the second embodiment further includes an extending portion 130 connected to the first L-shaped bending portion 122. The extending portion 130 is extended toward the first printed circuit board 140. The extending portion 130 is protruded and exposed from the plastic housing 110. The extending portion 130 is physically connected to the pad 160 of the first printed circuit board 140 for electrically connecting the first printed circuit board 140 to the step-shaped pin 120.

In order to better connecting the extending portion 130 to the pad 160 of the first printed circuit board 140, the integrated power module packaging structure 100 may further include a solder for soldering the extending portion 130 to the pad 160 of the first printed circuit board 140.

Figure 4:
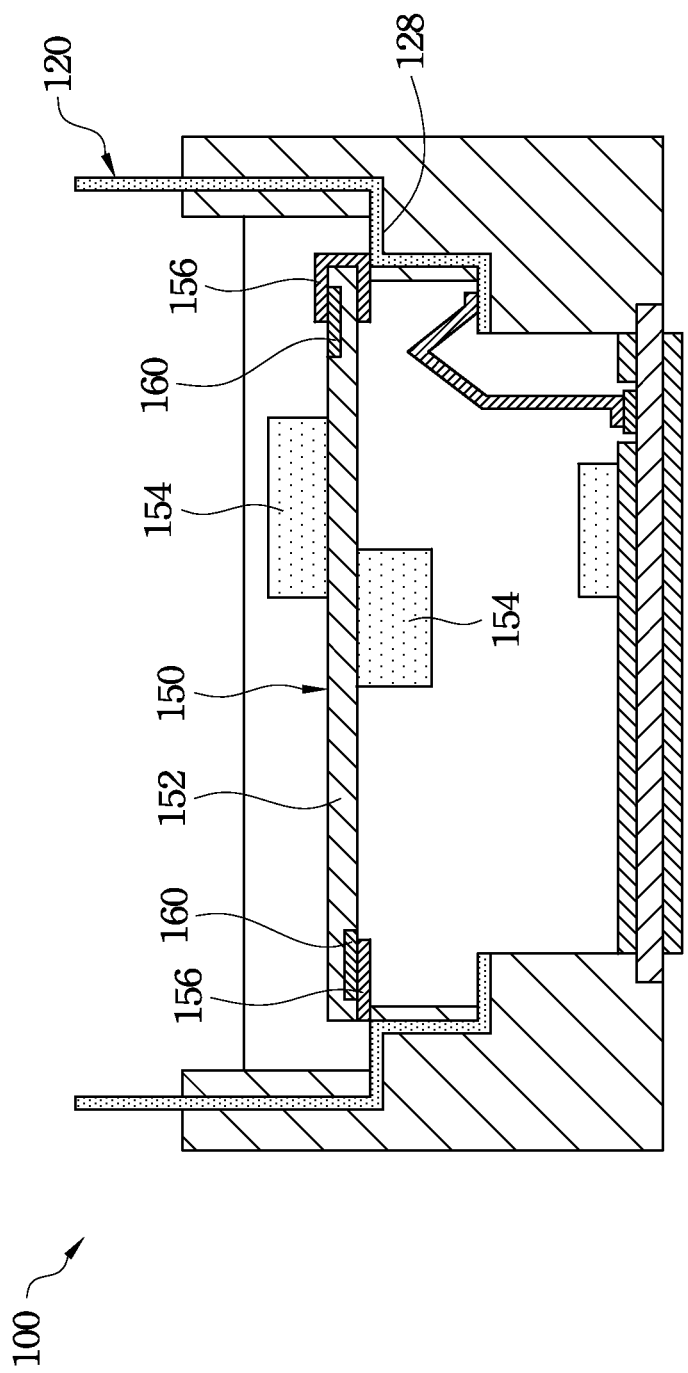
FIG. 4 is a cross-sectional view of a third embodiment of the integrated power module packaging structure of the invention.

FIG. 4 is a cross-sectional view of a third embodiment of the integrated power module packaging structure 100 of the invention. The difference between the first and third embodiment is that the second printed circuit board 150 is not electrically connected to the step-shaped pins 120 by the wire bonding process. The second printed circuit board 150 includes the multi-layer printed circuit board 152 and the electrical components 154 disposed on opposite surfaces of the multi-layer printed circuit board 152. The second printed circuit board 150 further includes a conductive layer 156 disposed at the edge of the multi-layer printed circuit board 152. The conductive layer 156 is not a continuous pattern, which includes a plurality of conductive blocks for connecting the pads 160 to the terminals of the electronic components 154 respectively. The pads 160 may be connected to the electronic components 154 by metal interconnection. The second printed circuit board 150 is electrically connected to the step-shaped pins 120 by the conductive layer 156.

More particularly, the conductive layer 156 can be utilized for electrically connecting the electronic component 154 disposed at the bottom surface of the multi-layer printed circuit board 152 (e.g. facing the first printed circuit board 140) to the step-shaped pins 120. The conductive layer 156 can also be utilized for electrically connecting the electronic component 154 disposed at the top surface of the multi-layer printed circuit board 152 (e.g. facing away from the first printed circuit board 140) to the step-shaped pins 120.

If the conductive layer 156 is utilized for only electrically connecting the bottom electronic component 154, then this part of the conductive layer 156 can be formed on the bottom surface of the multi-layer printed circuit board 152 and is extended to the edge of the multi-layer printed circuit board 152. The conductive layer 156 is physically connected to the second contact area 128. The electronic component 154 disposed at the bottom surface of the multi-layer printed circuit board 152 is electrically connected to the corresponding step-shaped pins 120 by the conductive layer 156.

If the conductive layer 156 is utilized for electrically connecting the top electronic component 154, then this part of the conductive layer 156 is formed covering the edge of the multi-layer printed circuit board 152, i.e., the conductive layer 156 is formed on the top surface, the side surface, and the bottom surface of the multi-layer printed circuit board 152. The conductive layer 156 formed on the top surface is physically connected to the terminals of the electronic component 154, and the conductive layer 156 formed on the bottom surface is physically connected to the second contact areas 128 of the step-shaped pins 120. The electronic component 154 disposed at the top surface of the multi-layer printed circuit board 152 is electrically connected to the corresponding step-shaped pins 120 by the conductive layer 156.

Similarly, in order to ensure the electrically connection between the conductive layer 156 and the second contact areas 128, the integrated power module packaging structure 100 may further include a solder or other possible material to fasten the conductive layer 156 to the second contact areas 128.

Figure 5:
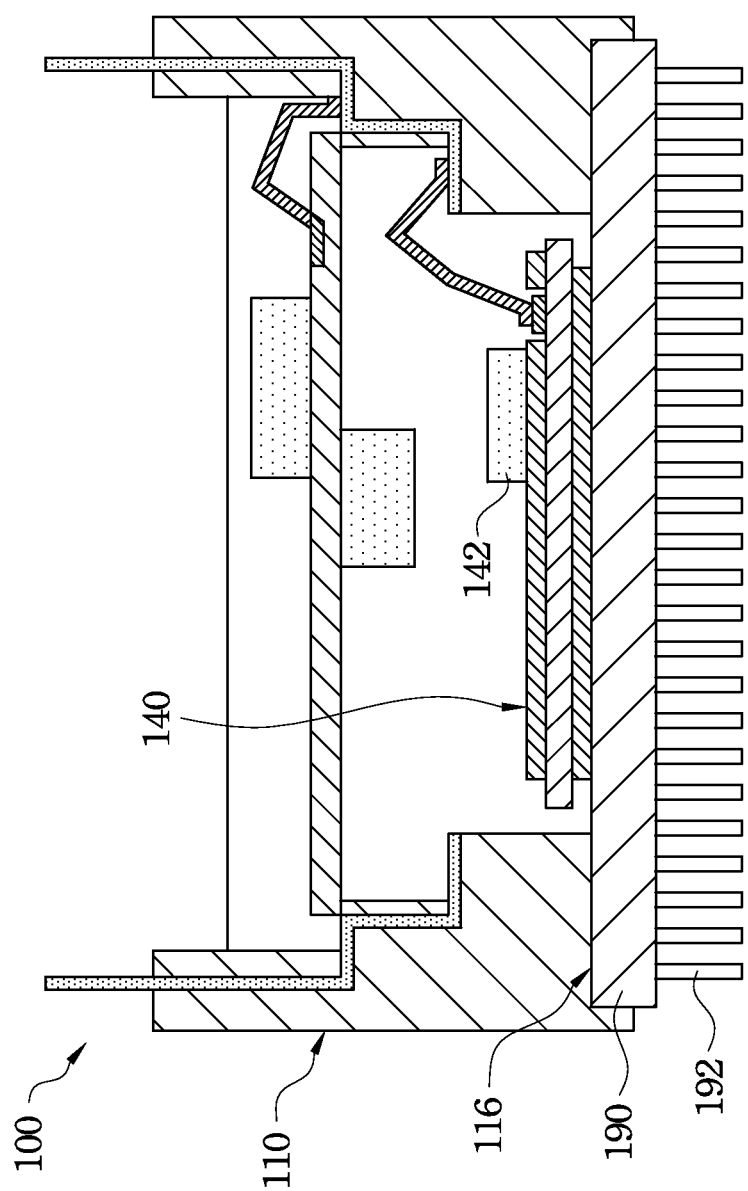
FIG. 5 is a cross-sectional view of a fourth embodiment of the integrated power module packaging structure of the invention.

FIG. 5 is a cross-sectional view of a fourth embodiment of the integrated power module packaging structure 100 of the invention. The difference between the first and fourth embodiment is that the integrated power module packaging structure 100 further includes a heat dissipation component for improving the heat dissipating ability of the integrated power module packaging structure 100. The heat dissipation component is physically connected to the first printed circuit board 140 to improve heat exchanging ability of the first printed circuit board 140. In this embodiment, the heat dissipation component includes a heat dissipation substrate 190 and a plurality of fins 192. The heat dissipation substrate 190 is disposed in the groove 116 of the plastic housing 110, and the first printed circuit board 140 is disposed on the heat dissipation substrate 10. The dissipation substrate 190 can be made of metal with good heat dissipating ability. The fins 192 are disposed on the heat dissipation substrate 190 and are facing away from the first printed circuit board 140, e.g., the fins 192 and the first printed circuit board 140 are disposed at two opposite surfaces of the heat dissipation substrate 190.

In some embodiments, the heat dissipation component can be the heat dissipation substrate 190, and the first printed circuit board 140 is disposed on the heat dissipation substrate 190. In some embodiments, the heat dissipation component can be the fins 192, and the fins 192 are disposed on the first printed circuit board 140. By using the heat dissipation component, such as the heat dissipation substrate 190 and/or the fins 192, the heat exchanging area of the integrated power module packaging structure 100 can be enlarged while dissipating the heat of the power device 142 on the first printed circuit board 140, and the heat exchanging efficiency of the integrated power module packaging structure 100 can be improved.

According to above embodiments, the integrated power module packaging structure integrates power device and the driving device[g1] in one packaging structure to reduce the volume of the inverter. The second printed circuit board can be the multi-layer printed circuit board, and the electronic devices arranged at two sides of the second printed circuit board can be electrically connected to each other via interconnection thereby reducing the space and raising assembly reliability. Furthermore, the first printed circuit board and the second printed circuit board can optionally electrically connected to the step-shaped pins according to different requirements thereby providing flexibility while assembling.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated power module packaging structure comprising:
    a plastic housing comprising a cavity;
    a plurality of step-shaped pins embedded in the plastic housing, wherein each of the step-shaped pins comprises a first L-shaped bending portion and a second L-shaped bending portion integrally formed as one connected piece, wherein the first L-shaped bending portion has a first part embedded by the plastic housing and a first contact area exposed of the plastic housing, the second L-shaped bending portion has a second part embedded by the plastic housing and a second contact area exposed of the plastic housing, wherein each of the step-shaped pins comprises the first contact area and the second contact area, and an end of at least one of the step-shaped pins has a protruded portion that protrudes from a surface of the plastic housing such that the protruded portion is exposed;
    a first printed circuit board disposed in the cavity, wherein the first printed circuit board is disposed with at least a power device and is electrically connected to the first contact area;
    a second printed circuit board disposed above the first printed circuit board in the cavity, wherein two opposite surfaces of the second printed circuit board are respectively disposed with at least an electronic device, and the second printed circuit board is electrically connected to the second contact area; and
    a plurality of bonding wires for directly connecting the first printed circuit board to at least a part of the first contact areas or directly connecting the second printed circuit board to at least a part of the second contact areas.

2. The integrated power module packaging structure of claim 1, wherein a part of the step-shaped pins are connected to both the first printed circuit board and the second printed circuit board.

3. The integrated power module packaging structure of claim 1, wherein the first printed circuit board has a plurality of pads, at least a part of the step-shaped comprises a plurality of extending portions connected to the first L-shaped bending portions, and the extending portions are physically connected to the pads.

4. The integrated power module packaging structure of claim 1, wherein the second printed circuit board comprises a multi-layer printed circuit board and a conductive layer disposed at an edge of the multi-layer printed circuit board, and the conductive layer is physically connected to at least a part of the second contact areas.

5. The integrated power module packaging structure of claim 1, wherein a height of a part of the step-shaped pins vertical to the second printed circuit board is greater than a height of another part of the step-shaped pins vertical to the second printed circuit board.

6. The integrated power module packaging structure of claim 5, wherein the part of the step-shaped pins having the greater height is the protruded portion, the another part of the step-shaped pins having the lesser height is fully embedded within the plastic housing, and the protruded portion is configured couple the integrated power module packaging structure with a component external to the integrated power module packaging structure.

7. The integrated power module packaging structure of claim 1, wherein the plastic housing comprises a flange, and the second printed circuit board is fastened on the flange.

8. The integrated power module packaging structure of claim 1, wherein the plastic housing comprises a groove, and the first printed circuit board is disposed in the groove.

9. The integrated power module packaging structure of claim 1, further comprising a heat dissipation component physically connected to the first printed circuit board.

10. The integrated power module packaging structure of claim 1, wherein the heat dissipation component comprises a heat dissipation substrate, the plastic housing comprises a groove, and the heat dissipation substrate is disposed in the groove.

11. The integrated power module packaging structure of claim 10, wherein the heat dissipation component further comprises a plurality of fins disposed at a surface of the heat dissipation substrate opposite to the first printed circuit board.

* * * * *